United States Patent [19]

Wu

[11] Patent Number: 6,069,031
[45] Date of Patent: *May 30, 2000

[54] PROCESS TO FORM CMOS DEVICES WITH HIGHER ESD AND HOT CARRIER IMMUNITY

[75] Inventor: Shye-Lin Wu, Hsinchu, Taiwan

[73] Assignee: Texas Instruments - Acer Incorporated, Hsinchu, Taiwan

[*] Notice: This patent is subject to a terminal disclaimer.

[21] Appl. No.: 09/013,694

[22] Filed: Jan. 26, 1998

[51] Int. Cl.[7] .................................................. H01L 21/336
[52] U.S. Cl. ......................... 438/197; 438/199; 438/659; 438/766
[58] Field of Search ........................... 257/360; 438/200, 438/229, 232, 197, 199, 659, 766

[56] References Cited

U.S. PATENT DOCUMENTS

| 5,481,129 | 1/1996 | DeJong et al. | 257/360 |
| 5,897,348 | 4/1999 | Wu | 438/200 |

OTHER PUBLICATIONS

Kueing–Long Chen, Effects of Interconnect Process and Snapback Voltage on the ESD Failure Threshold of NMOS Transistors, 1988 EOS, pp. 212–219.

T. Mizuno et al., Hot–Carrier Effects in 0.1μm Gate Length COMS Devices, 1992 IEEE, pp. 695–698.

Takashi Hori, A 0.1–μm COMS Technology with Tilt–Implanted Punchthrough Stopper (TIPS), 1994 IEEE, pp. 75–78.

Primary Examiner—David Nelms
Assistant Examiner—Reneé R. Berry
Attorney, Agent, or Firm—Harness, Dickey & Pierce, P.L.C.

[57] ABSTRACT

The process includes the following steps. At first, an isolation region in the semiconductor substrate is formed to separate the semiconductor substrate into a PMOS region, a NMOS region, and an ESD protective region. Gate structures are then formed on the PMOS region, the NMOS region, and the ESD protective region. A doping process is performed to the NMOS region and the ESD protective region, with first dopants for a lightly doped region in the semiconductor substrate. Another doping process is performed to the PMOS region and the ESD protective region, with second dopants for a PMOS anti-punchthrough region and an ESD double diffused region. Spacer structures are formed around the gate structures. The NMOS region and the ESD protective region are then doped with third dopants, for a n-junction region in the semiconductor substrate uncovered by the gate structures. The PMOS region is doped with fourth dopants for a p-junction region in the semiconductor substrate uncovered by the gate structures. Finally, a thermal process is performed to the semiconductor substrate to activate the first dopants, the second dopants, the third dopants, the fourth dopants.

23 Claims, 3 Drawing Sheets

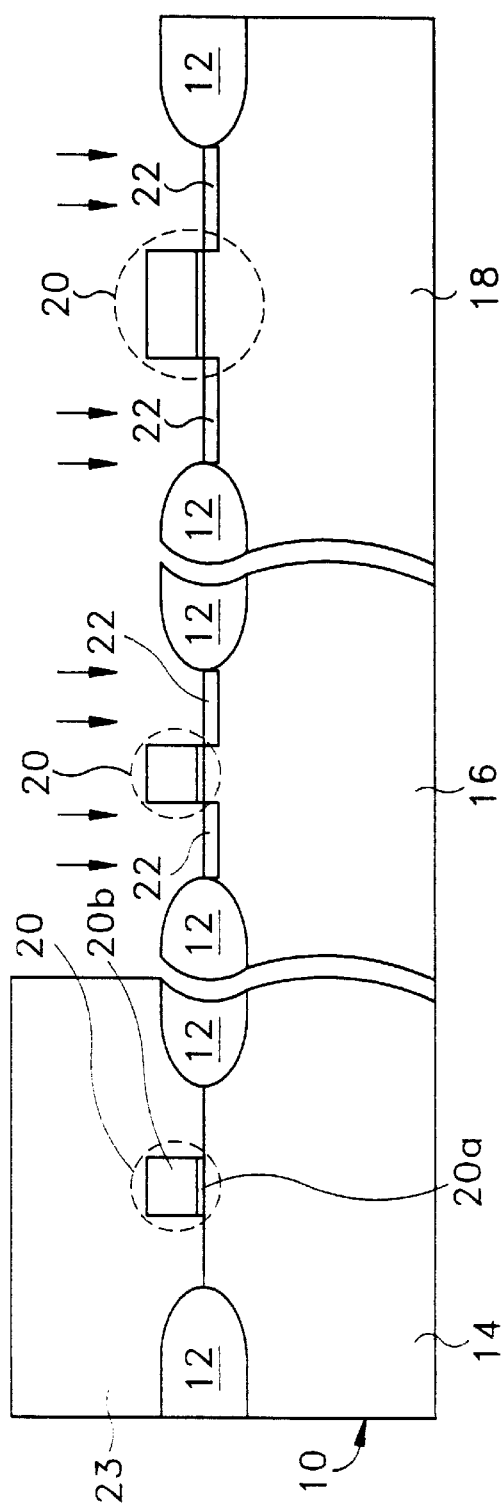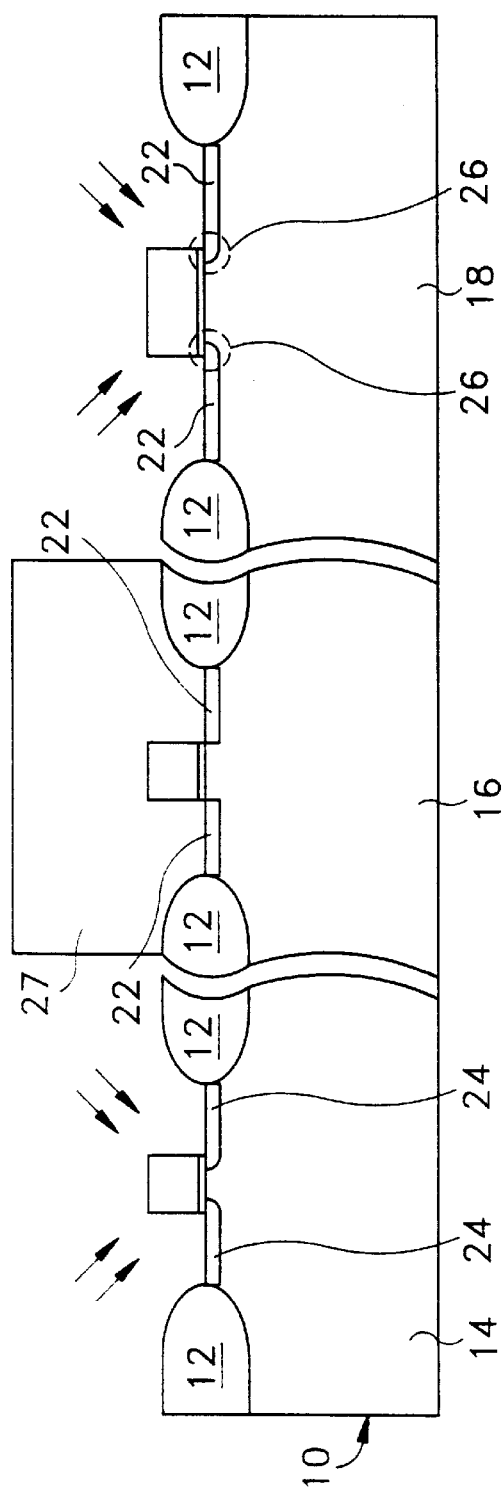

PROCESS TO FORM CMOS DEVICES WITH HIGHER ESD AND HOT CARRIER IMMUNITY

FIELD OF THE INVENTION

The present invention relates to the transistors in semiconductor manufacturing, and more specifically, to a process of forming the CMOS (complementary metal oxide semiconductor) transistors with higher ESD (electrostatic discharge) and hot carrier immunity.

BACKGROUND OF THE INVENTION

With the progress of the semiconductor integrated circuits to the ULSI (ultra large scale integration) levels or even higher level, the integrity of the integrated circuits rises at an amazing rate. The capacity of a single semiconductor chip increases from several thousand devices to hundreds of million devices, or even billions of devices. Taking DRAM (dynamic random access memories) for example, the increasing integrity in manufacturing extends the capacity of a single chip to step from earlier 4 megabit to 16 megabit, and further to 256 megabit or even higher. The integrated circuit devices like transistors, capacitors, and connections must be greatly narrowed in accordance with these advancements. The increasing packing density of the integrated circuits generates numerous challenges to the semiconductor manufacturing process. Every element or device needs to be formed within a smaller area without influencing the characteristics and operations of the integrated circuits. The demands on high packing density, low heat generation, and low power consumption devices with good reliability and long operating life must be maintained without any degradation in the function. These achievements are expected to be reached with the simultaneous developments and advancements in photography, etching, deposition, ion implantation, and thermal processing technologies, the five big aspects of semiconductor manufacturing. The present technology research focus mainly on the sub-micron and one-tenth micron semiconductor devices to manufacture highly reliable and densely arranged integrated circuits.

Transistors, or more particularly the metal oxide semiconductor (MOS) transistors, are the most important and frequently employed devices among integrated circuits. However, with the continuous narrowing of device size, the sub-micron scale MOS transistors have to face many risky challenges. As the MOS transistors become narrower and thinner accompanying shorter channels, problems like junction punchthrough, leakage, and the contact resistance cause the reduction in the yield and the reliability of the semiconductor manufacturing processes. Technologies like the shallow junctions are utilized in combating the undesirable effects to manufacture the densely packed devices with good yield.

The electrostatic discharge (ESD) attacking has became a serious problem as the feature size of the MOS transistors has been scaled down. A semiconductor device having the input/output pad connections with external circuitry and devices is subject to the problem of the ESD. The ESD is easily conducted through the input/output and the power lead connections into the internal devices and causes some problems to the semiconductor devices, especially serious ones like the gate oxide breakdown and damage from overheating. The high voltage gradient generated between the contacts and the channels from the ESD causes the gate oxide electron injection and the carrier acceleration effect in the channels. The characteristics and operations of the devices are easily influenced by the inducing effects of the ESD. High levels of ESD with several hundred volts to a few thousand volts, which is easily transferred to the pins of an IC package during the handling, can bring a permanent destruction to the internal devices. For preventing the devices from the ESD damage, built-in ESD protection circuits are connected between the input/output pads and the internal circuitry. A high level of abnormal discharge conducted into the pins of an IC package is kept out by the ESD protection circuits from flowing into the devices. The discharges are guided through the ESD protection circuits to the ground and the damage to the semiconductor devices is eliminated.

With the scaling down of the feature size of the MOS transistors, short channel effects are frequently presented to reduce the threshold voltage and influence the operations of the devices. Generally, the lightly doped drain (LDD) and the large-angle-tilt implant drain (LATID) technologies are widely employed to reduce the short channel effects. In the work of T. Mizlmo et al., "Hot-Carrier Effects in 0.1 $\mu$m Gate Length CMOS Devices" (in IEDM Tech. Dig., p.695, 1996), the LDD structures are one of the four key technologies disclosed to realize 0.1 micrometer CMOS devices. The LDD structure are adopted to reduce both the p-n junction depth and the lateral diffusion length of the source/drain extension. The band-to-band tunneling leakage current is also suppressed. The hot-carrier effects were investigated in their work. They concluded that the hot-carrier effects in 0.1 micrometer devices are still one of the major concerns, in spite of reducing the supply voltage.

Various investigations relating to the LATID technologies have been undertaken. A 0.1 micrometer CMOS technology with tilt-implanted punchthrough stopper (TIPS) is proposed by T. Hori ("A 0.1 $\mu$m CMOS Technology with Tilt-Implanted Punchthrough Stopper (TIPS)", in IEDM Tech. Dig., p.75, 1994). The capability of large-angle-tilt (LAT) implant in realizing efficient punchthrough stopper pockets while keeping process compatibility is introduced in the work. They demonstrate that LAT implant can be optimized to realize sufficient punchthrough stopper pockets with suppressed bottom junction capacitance. They also propose a 0.1 micrometer TIPS CMOS technology for the first time as a most practical candidate for the 0.1 micrometer generation.

Unfortunately, it has reported that both the LDD and the LATID MOSFET (metal oxide semiconductor field effect transistor) structures are quite vulnerable to electrostatic discharge (ESD). The details of the ESD failures relating the device structures were disclosed in the investigation made by K. L. Chen ("Effects of Interconnect Process and Snapback Voltage on the ESD Failure Threshold of NMOS Transistors", in 1988 EOS/ESD Symposium Porceedings, p. 212). It is found that different device structures have different ESD failure threshold voltages. For the same dimension of NMOS transistors, the LDD transistor has the lowest ESD protection level when compared to DDD (double diffused drain) transistors. The high snapback voltage of these graded drain transistors, especially LDD transistors, has resulted in the ESD performance degradation. Although the DDD MOSFET device has a higher immunity to the ESD, it also shows a worse short channel effect as compared to the LDD or LATID MOSFET structures.

SUMMARY OF THE INVENTION

A process of forming CMOS devices with improved ESD and hot carrier immunity is provided in the present invention. The ESD immunity of the devices are raised with a DDD structure. The hot carrier effect accompanying with the short channels can be eliminated with a LDD structure of the NMOS transistors and the anti-punchthrough doping in the PMOS transistors. The ESD and hot carrier immunity can be reached with the higher packing density of the integrated circuits.

The method of forming the CMOS transistors in a semiconductor substrate with the ESD protection transistors includes the following steps. At first, an isolation region in the semiconductor substrate is formed to separate the semiconductor substrate into a PMOS region, a NMOS region, and an ESD protective region. A plurality of gate structures are then formed on the PMOS region, the NMOS region, and the ESD protective region. A doping process is performed to the semiconductor substrate of the NMOS region and the ESD protective region, with first dopants for a lightly doped region in the semiconductor substrate uncovered by the gate structures. Another doping process is performed to the semiconductor substrate of the PMOS region and the ESD protective region, with second dopants for a PMOS anti-punchthrough region and an ESD double diffused region in the semiconductor substrate under the gate structures. A plurality of spacer structures are formed around the gate structures. The semiconductor substrate of the NMOS region and the ESD protective region is then doped with third dopants, for a n-junction region in the semiconductor substrate uncovered by the gate structures. The semiconductor substrate of the PMOS region are doped with fourth dopants for a p-junction region in the semiconductor substrate uncovered by the gate structures. Finally, a thermal process is performed to the semiconductor substrate to activate the first dopants, the second dopants, the third dopants, the fourth dopants.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein:

FIG. 1 illustrates a cross-sectional view of doping first dopants on the semiconductor substrate with an isolation region, the gate structures in the present invention.

FIG. 2 illustrates a cross-sectional view of doping second dopants on the PMOS region and the ESD protective region in the present invention.

DETAILED DESCRIPTION OF THE PREFERRED EMBODIMENT

Figure 3:
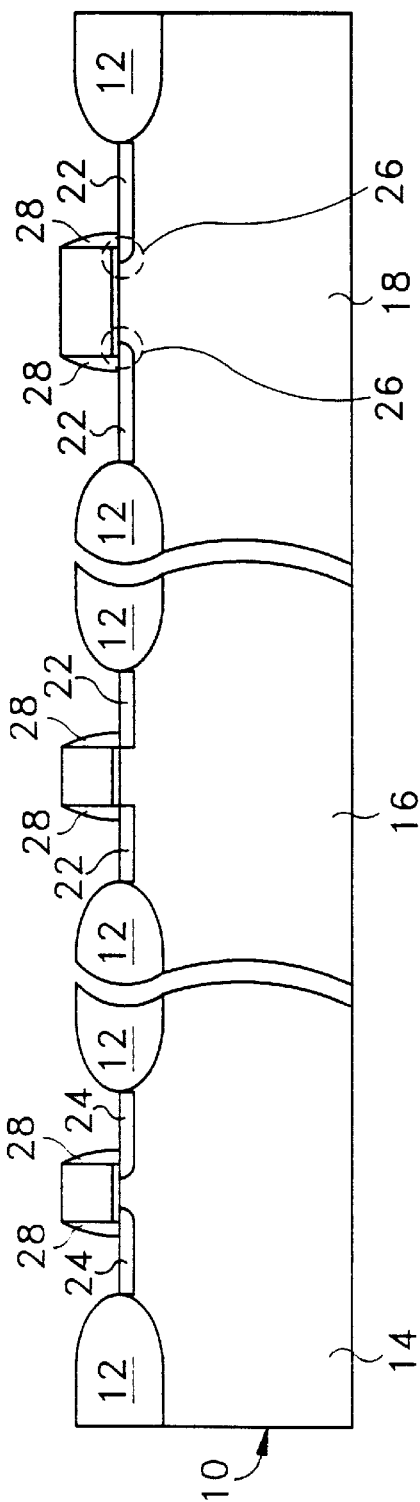
FIG. 3 illustrates a cross-sectional view of the semiconductor substrate with the formation of the spacers in the present invention.

A process of forming CMOS devices with improved ESD and hot carrier immunity is provided in the present invention. Via an ESD protection structure and the circuits connecting with the input/output terminals, any undesirable high voltage discharge can be conducted to the ground through the substrate. The internal devices are thus prevented from being damaged. The method can be incorporated into the conventional semiconductor manufacturing processes for manufacturing the NMOS and the PMOS transistors. One, or generally more, ESD protection MOS transistors are formed in an ESD protective simultaneously with a serious of cost efficient processes. The NMOS transistors with a lightly doped drain (LDD) structure can be manufactured to relieve the short channel effects. The ESD protective devices with double diffused drain (DDD) junction can be formed by utilizing the large-angle-tilt implant drain (LATID) technology. The PMOS transistors with anti-punchthrough stopping implant are also formed with the large-angle-tilt implant technology. The hot carrier effect can be reduced. The method for forming the small feature size devices like deep sub-micrometer scale devices overcoming present ESD and operation speed challenges is described as following.

Referring to FIG. 1, a semiconductor substrate 10 with a preferable single crystalline silicon in a <100> direction is provided. An isolation region, like the field oxide (FOX) region 12, is formed on the semiconductor substrate. The formation process of the FOX region 12 are as follows. In general, a thin silicon oxide layer (not shown) is thermally grown on the semiconductor substrate 10 with the thickness in the range of about 20 A° (angstroms) to 300 A°. A silicon nitride layer, which is also not shown in the figure, is then deposited thereon. The silicon nitride layer is utilized as a layer for inhibiting the FOX growth on an active region of the semiconductor substrate. The silicon nitride layer is then patterned to etch off the region for forming the FOX. The semiconductor substrate is subjected to a thermal process, for example, the thermal process performed in a steam and oxygen containing ambient. The region of the silicon oxide layer uncovered by the silicon nitride layer is grown to be the FOX region 12 as an isolation region shown in FIG. 1. The FOX region 12 separates the semiconductor substrate into a PMOS region 14, a NMOS region 16, and an ESD protective region 18. The silicon nitride layer is than removed using etchants like a hot phosphoric acid solution. The isolation region on the semiconductor substrate 10 can be created through other isolation technologies which are well known in the art, like the trench isolation and so on, with the same purpose of splitting respective active regions.

A plurality of gate structures 20, including one or more gate structures respectively on the PMOS region 14, the NMOS region 16, and the ESD protective region 18 are formed. In general, each of the gate structures 20 includes a gate insulator layer 20a formed over the semiconductor substrate 10 and a gate conductor 20b over the gate insulator 20a. The gate insulator layer 20a can be an oxide layer grown thermally from the semiconductor substrate 10 in oxygen containing ambient, with a thickness between about 20 angstroms and about 400 angstroms. In general, the silicon oxide layer formed in the formation of the FOX region 12 can be used as the gate insulator 20a. Alternatively, the gate insulator layer 20a can also be an oxynitride layer grown thermally from the semiconductor substrate in a nitrogen and oxygen containing ambient, with a thickness between about 20 angstroms to about 400 angstroms. The thermally grown oxynitride layer provides an improved gate insulator 20a and can be utilized especially under higher specification for the operation characteristics of the MOS devices. The gate conductor 20b can be an undoped polysilicon layer, or an undoped polysilicon layer in combination with other conductive layers. The undoped polysilicon layer is formed by chemical vapor deposition.

The semiconductor substrate 10 is then doped with first dopants to the NMOS region 16 and the ESD protective region 18. The first dopants are diffused and actived with a thermal process performed later as a lightly doped region 22, in the semiconductor substrate 10 uncovered the gate structures 20. The first dopants are doped with an ion implanting process at an energy between about 5 KeV to 100 KeV, to have a dose between about 1E12 to 1E14 atoms/cm$^3$ for the lightly doped region 22. In general, a photoresist layer 23 is formed and defined to cover over the PMOS region 14 for keeping the ions off. In the preferred embodiment, the first dopants can be arsenic containing dopants and phosphorous containing dopants.

Referring to FIG. 2, the semiconductor substrate 10 of the PMOS region 14 and the ESD protective region 16 are then doped with second dopants. The second dopants are diffused and actived as a PMOS anti-punchthrough region 24 and an ESD double diffused region 26 with the thermal process performed later, in the semiconductor substrate 10 under the gate structures 20. The second dopants are doped with an ion implanting process at an energy between about 5 KeV to 120 KeV, to have a dose between about 5E11 to 5E14 atoms/cm$^3$ for the PMOS anti-punchthrough region 24 and the ESD double diffused region 26. A tilt-angle implantation technique is used here to implant the ions into the semiconductor substrate 10 under the gate structures 20. The tilt-angle can varied from 0 degree to 60 degrees to adjust the doped region. Generally, a photoresist layer 27 is formed and defined to cover over the NMOS region 16 to prevent it from the implantation of ions. In this case, the second dopants can be arsenic-containing dopants and phosphorous-containing dopants.

Figure 4:
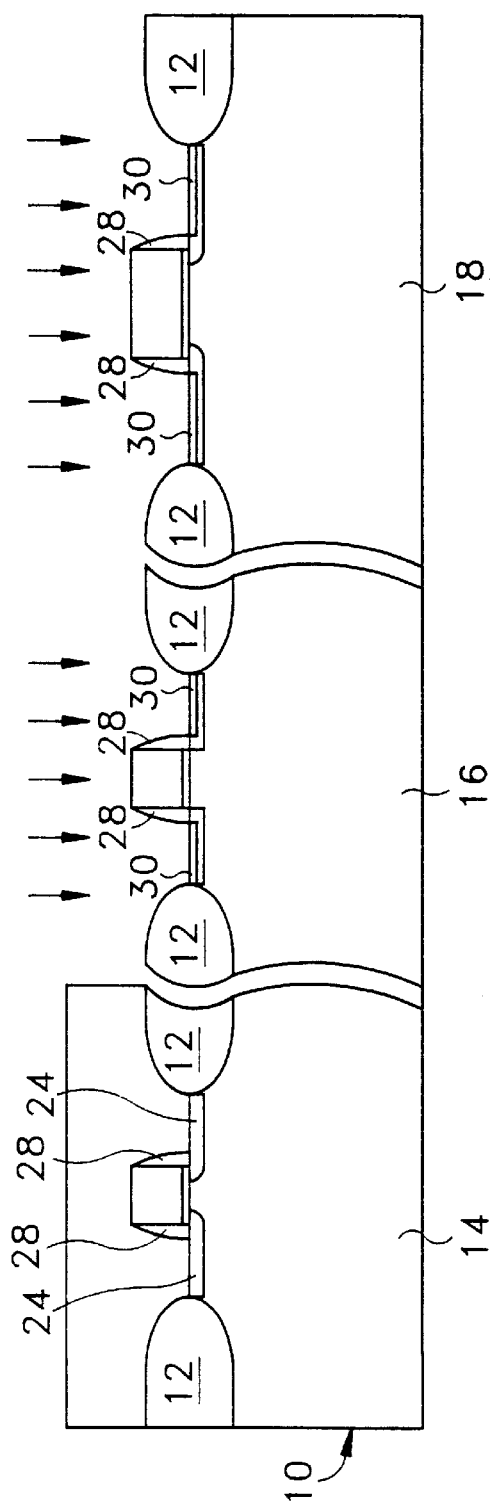
FIG. 4 illustrates a cross-sectional view of doping fourth dopants on the NMOS region and the ESD protective region in the present invention.

The spacer structures 28 are formed around the gate structures 20, as shown in FIG. 3. As an example, the spacer structures 28 can be oxide spacers. The oxide spacers 28 are formed by sequentially depositing and etching back a CVD (chemical vapor deposited) oxide film with a thickness of about 500 angstroms to about 2500 angstroms. Thus around every gate structure 20, an oxide spacer 28 is formed. Referring to FIG. 4, a doping process is then performed to the semiconductor substrate 10 of the NMOS region 16 and the ESD protective region 18 with third dopants. The third dopants are diffused and actived as a n-junction region 30 with the thermal process performed later, in the semiconductor substrate 10 uncovered by the gate structures 20. The third dopants are doped with an ion implanting process at an energy between about 0.5 KeV to 100 KeV, to have a dose of between about 1E14 to 1E16 atoms/cm$^3$ for the n-junction region 30. A photoresist layer 31 is formed and defined to cover over the PMOS region 14 to prevent it from the implantation of ions during the process. As an example, the third dopants can be arsenic-containing dopants and phosphorous-containing dopants.

Figure 5:
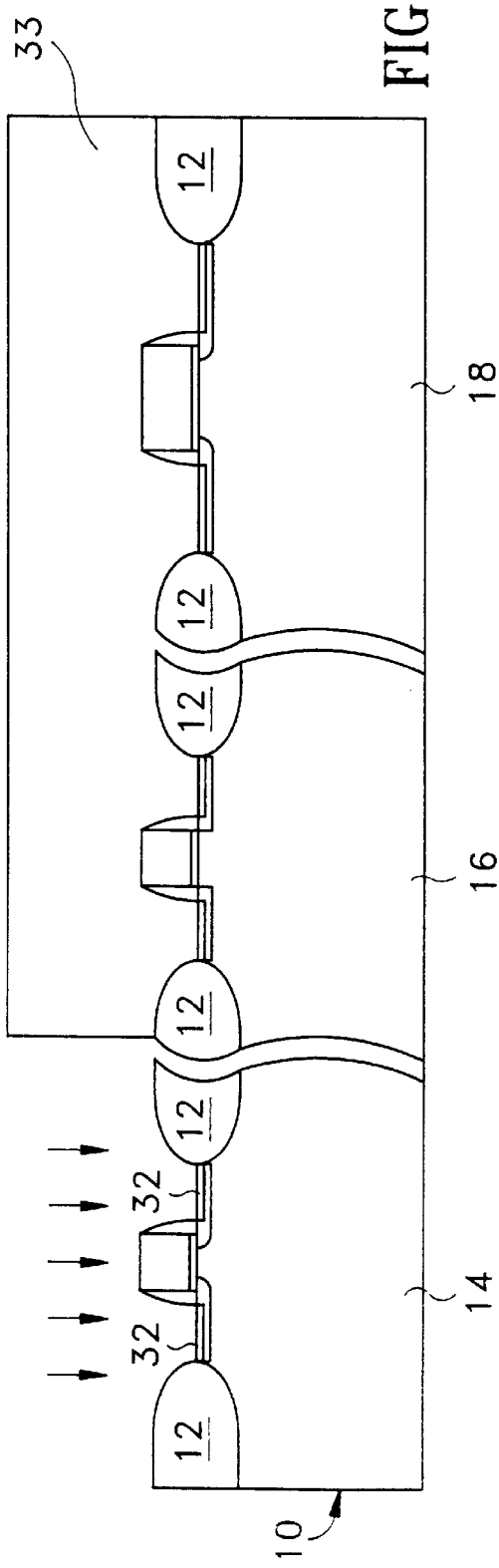
FIG. 5 illustrates a cross-sectional view of doping fourth dopants on the PMOS region in the present invention.

Another doping process is performed to the semiconductor substrate 10 of the PMOS region 14 with fourth dopants, as shown in FIG. 5. The fourth dopants are diffused and actived as a p-junction region 32 in the semiconductor substrate 10 uncovered by the gate structures 20, with the thermal process performed later. The fourth dopants are doped with an ion implanting process at an energy between about 0.5 KeV to 60 KeV, to have a dose between about 1E14 to 1E16 atoms/cm$^3$ for the p-junction region 32. A photoresist layer 33 can be formed and defined to cover over the NMOS region 16 and the ESD protective region 18 to keep off the implantation of ions. As an example, the fourth dopants can be boron-containing dopants.

Figure 6:
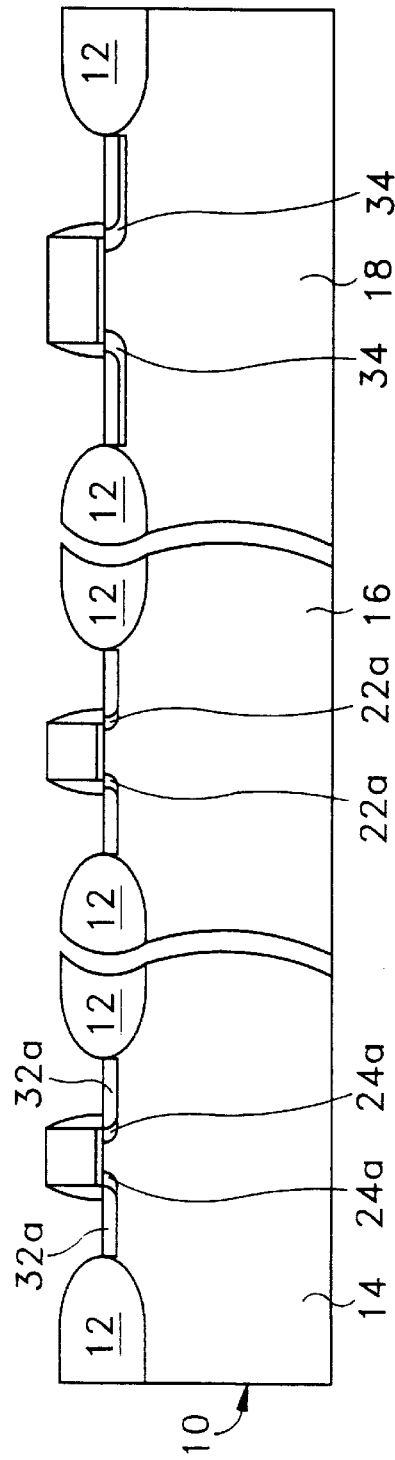
FIG. 6 illustrates a cross-sectional view of the semiconductor substrate in the present invention after a thermal process is performed.

Finally, a thermal process is then performed to the semiconductor substrate 10 to activate and redistribute all the dopants. As an example, a rapid thermal process with a temperature of about 750° C. to 1150° C. can be applied. Referring to FIG. 6, the ions in the PMOS anti-punchthrough region 24 and the p-junction region 32 are driven in and activated. Thus the PMOS devices with a source/drain junction 32a and a punchthrough stopping pocket region 24a are formed in the PMOS region 14. In the NMOS region 16, the ions in the lightly doped region 22 and the n-junction region 30 are diffused. The NMOS devices with a lightly doped drain (LDD) structure 22a are formed as shown in FIG. 6. The ESD protective transistors with the double diffused drain (DDD) structure 34 diffused from the lightly doped region 22, the ESD double diffused region 26, and the n-junction region 30 are formed in the ESD protective region 18. In fact, part of the ions can be diffused simultaneously within some previous processes which performed with a high temperature to the semiconductor substrate 10, like a CVD deposition of an oxide layer. The semiconductor substrate 10 can subject to the high temperature of about 600 ° C. to 800 ° C. in the process like TEOS oxide deposition.

The CMOS transistors with the ESD protection circuits are formed according to the method of the present invention. All the transistors can be respectively formed within the PMOS region 14, the NMOS region 16, and the ESD protective region 18 with the above easily incorporated processes which are compatible with the present semiconductor manufacturing processes. The ESD immunity of the devices are raised with the DDD structure against the less protective LDD structure. The NMOS devices and PMOS devices are formed without the less operative DDD structure. In contrast, the LDD structure is formed for the NMOS transistors and the anti-punchthrough pocket is formed of the PMOS transistors. The hot carrier effect accompanying with the short channels can be eliminated with the LDD structure and the anti-punchthrough pocket respectively in the NMOS and the PMOS region. The ESD and hot carrier immunity can be reached with higher packing density of the integrated circuits with the highly compatible and cost efficient process of the present invention.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a MOS transistor in a semiconductor substrate, said method comprising the steps of:

forming an isolation region in said semiconductor substrate, said isolation region separating said semiconductor substrate into a PMOS region, a NMOS region, and an ESD protective region;

forming a plurality of gate structures on said PMOS region, said NMOS region, and said ESD protective region;

doping said semiconductor substrate of said NMOS region and said ESD protective region, with first dopants for a lightly doped region in said semiconductor substrate uncovered by said plurality of gate structures;

doping said semiconductor substrate of said PMOS region and said ESD protective region, with second dopants for a PMOS anti-punchthrough region and an ESD double diffused region in said semiconductor substrate under said plurality of gate structures;

forming a plurality of spacer structures around said plurality of gate structures;

doping said semiconductor substrate of said NMOS region and said ESD protective region, with third dopants for a n-junction region in said semiconductor substrate uncovered by said plurality of gate structures;

doping said semiconductor substrate of said PMOS region, with fourth dopants for a p-junction region in said semiconductor substrate uncovered by said plurality of gate structures; and performing a thermal process to said semiconductor substrate to activate said first dopants, said second dopants, said third dopants, said fourth dopants.

2. The method of claim 1, wherein said isolation region comprises a field oxide isolation, said field oxide isolation being thermal grown from said semiconductor substrate in a oxygen containing ambient, with a thickness between about 3000 angstroms to about 10000 angstroms.

3. The method of claim 1, wherein each of said plurality of gate structures comprises:
a gate insulator layer formed over said semiconductor substrate; and
a gate conductor formed over said gate insulator.

4. The method of claim 3, wherein said gate insulator layer comprises an oxide layer grown thermally from said semiconductor substrate in an oxygen containing ambient, with a thickness between about 20 angstroms to about 400 angstroms.

5. The method of claim 3, wherein said gate insulator layer comprises an oxynitride layer grown thermally from said semiconductor substrate in a nitrogen and oxygen containing ambient, with a thickness between about 20 angstroms to about 400 angstroms.

6. The method of claim 3, wherein said gate conductor comprises an undoped polysilicon layer, said undoped polysilicon layer being formed by chemical vapor deposition.

7. The method of claim 1, wherein said first dopants are doped with an ion implanting process at an energy between about 5 KeV to 100 KeV, to have a dose between about 1E2 to 1E14 atoms/cm$^3$ for said lightly doped region, said first dopants being selected from the group consisting of arsenic containing dopants and phosphorous containing dopants.

8. The method of claim 1, wherein said second dopants are doped with an ion implanting process at an energy between about 5 KeV to 120 KeV, to have a dose between about 5E11 to 5E14 atoms/cm$^3$ for said PMOS anti-punchthrough region and said ESD double diffused region, said ion implanting process being performed with a tilt angle of about 0 degree to 60 degrees, said second dopants being selected from the group consisting of arsenic containing dopants and phosphorous containing dopants.

9. The method of claim 1, wherein said plurality of spacer structures comprise oxide spacers, said oxide spacers being formed by depositing and etching back a CVD (chemical vapor deposited) oxide film with a thickness of about 500 angstroms to about 2500 angstroms.

10. The method of claim 1, wherein said third dopants are doped with an ion implanting process at an energy between about 0.5 KeV to 100 KeV, to have a dose between about 1E14 to 1E16 atoms/cm$^3$ for said n-junction region, said third dopants being selected from the group consisting of arsenic containing dopants and phosphorous containing dopants.

11. The method of claim 1, wherein said fourth dopants are doped with an ion implanting process at an energy between about 0.5 KeV to 60 KeV, to have a dose between about 1E14 to 1E16 atoms/cm$^3$ for said p-junction region, said fourth dopants comprising boron containing dopants.

12. The method of claim 1, wherein said thermal process comprises a rapid thermal process with a temperature of about 750° C. to 1150° C.

13. A method of forming a MOS transistor in a semiconductor substrate, said method comprising the steps of:

forming an isolation region in said semiconductor substrate, said isolation region separating said semiconductor substrate into a PMOS region, a NMOS region, and an ESD protective region;

forming a plurality of gate structures on said PMOS region, said NMOS region, and said ESD protective region, each of said plurality of gate structures comprising a gate insulator layer formed over said semiconductor substrate, and a gate conductor formed over said gate insulator;

doping said semiconductor substrate of said NMOS region and said ESD protective region, with first dopants for a lightly doped region in said semiconductor substrate uncovered by said plurality of gate structures, said first dopants being selected from the group consisting of arsenic containing dopants and phosphorous containing dopants;

doping said semiconductor substrate of said PMOS region and said ESD protective region, with second dopants for a PMOS anti-punchthrough region and an ESD double diffused region in said semiconductor substrate under said plurality of gate structures, said second dopants being selected from the group consisting of said arsenic containing dopants and said phosphorous containing dopants;

forming a plurality of spacer structures around said plurality of gate structures;

doping said semiconductor substrate of said NMOS region and said ESD protective region, with third dopants for a n-junction region in said semiconductor substrate uncovered by said plurality of gate structures, said third dopants being selected from the group consisting of said arsenic containing dopants and said phosphorous containing dopants;

doping said semiconductor substrate of said PMOS region, with fourth dopants for a p-junction region in said semiconductor substrate uncovered by said plurality of gate structures, said fourth dopants comprising boron containing dopants; and performing a thermal process to said semiconductor substrate to activate said first dopants, said second dopants, said third dopants, said fourth dopants.

14. The method of claim 13, wherein said isolation region comprises a field oxide isolation, said field oxide isolation being thermal grown from said semiconductor substrate in a oxygen containing ambient, with a thickness between about 3000 angstroms to about 10000 angstroms.

15. The method of claim 13, wherein said gate insulator layer comprises an oxide layer grown thermally from said semiconductor substrate in an oxygen containing ambient, with a thickness between about 20 angstroms to about 400 angstroms.

16. The method of claim 13, wherein said gate insulator layer comprises an oxynitride layer grown thermally from said semiconductor substrate in a nitrogen and oxygen containing ambient, with a thickness between about 20 angstroms to about 400 angstroms.

17. The method of claim 13, wherein said gate conductor comprises an undoped polysilicon layer, said undoped polysilicon layer being formed by chemical vapor deposition.

18. The method of claim 13, wherein said first dopants are doped with an ion implanting process at an energy between 5 KeV to 100 KeV, to have a dose between about 1E12 to 1E14 atoms/cm$^3$ for said lightly doped region.

19. The method of claim 13, wherein said second dopants are doped with an ion implanting process at an energy between about 5 KeV to 120 KeV, to have a dose between about 5E11 to 5E14 atoms/cm$^3$ for said PMOS anti-punchthrough region and said ESD double diffused region, said ion implanting process being performed with a tilt angle of about 0 degree to 60 degrees.

20. The method of claim 13, wherein said plurality of spacer structures comprise oxide spacers, said oxide spacers being formed by depositing and etching back a CVD (chemical vapor deposited) oxide film with a thickness of about 500 angstroms to about 2500 angstroms.

21. The method of claim 13, wherein said third dopants are doped with an ion implanting process at an energy between 0.5 KeV to 100 KeV, to have a dose between about 1E14 to 1E16 atoms/cm$^3$ for said n-junction region.

22. The method of claim 13, wherein said fourth dopants are doped with an ion implanting process at an energy between about 0.5 KeV to 60 KeV, to have a dose between about 1E14 to 1E16 atoms/cm$^3$ for said p-junction region.

23. The method of claim 13, wherein said thermal process comprises a rapid thermal process with a temperature of about 750° C. to 1150° C.

* * * * *